US012559860B1

(12) United States Patent
Jorgenson

(10) Patent No.: US 12,559,860 B1
(45) Date of Patent: Feb. 24, 2026

(54) REACTIVE GAS MODULATION FOR GROUP III/IV COMPOUND DEPOSITION SYSTEMS

(71) Applicant: Robbie J. Jorgenson, Minneapolis, MN (US)

(72) Inventor: Robbie J. Jorgenson, Minneapolis, MN (US)

( * ) Notice: Subject to any disclaimer, the term of this patent is extended or adjusted under 35 U.S.C. 154(b) by 30 days.

(21) Appl. No.: 17/543,296

(22) Filed: Dec. 6, 2021

Related U.S. Application Data

(63) Continuation-in-part of application No. 17/520,691, filed on Nov. 7, 2021, now abandoned.

(Continued)

(51) Int. Cl.
　*C30B 25/06* 　　(2006.01)
　*C23C 14/06* 　　(2006.01)
(Continued)

(52) U.S. Cl.
　CPC .......... *C30B 25/06* (2013.01); *C23C 14/0617* (2013.01); *C23C 14/0641* (2013.01); *C30B 29/403* (2013.01); *C30B 29/406* (2013.01); *H01L 21/0242* (2013.01); *H01L 21/02458* (2013.01); *H01L 21/0254* (2013.01); *H01L 21/02631* (2013.01); *H10H 20/01335* (2025.01);
(Continued)

(58) Field of Classification Search
　CPC . C23C 14/0617; C23C 14/0641; C03B 25/06; H01L 21/0242; H01L 21/02458; H01L 21/0254; H01L 21/02631; H01L 33/007; H01L 33/06; H01L 33/32; H01L 33/405

USPC ........................................ 204/192.25, 298.07
See application file for complete search history.

(56) References Cited

U.S. PATENT DOCUMENTS 3,915,764 A　　10/1975　Noreika et al.
4,640,737 A　　2/1987　Nagasaka et al.
(Continued)

FOREIGN PATENT DOCUMENTS

DE　　102004006530 A1 *　2/2004
JP　　2012-246204　　* 12/2012

OTHER PUBLICATIONS

Machine Translation JP 2012-246204 (Year: 2012).*
(Continued)

*Primary Examiner* — Rodney G McDonald
(74) *Attorney, Agent, or Firm* — DeWitt LLP

(57) ABSTRACT

A process for producing semiconductor structures comprising one of more layers of Group III/IV Compounds deposited onto a template using PVD sputtering the resulting semiconductor structures is provided according to the invention. The Group III or Group IV material may be gallium, hafnium, indium, aluminum, silicon, germanium, magnesium and/or zirconium. The anion provided by a reactive gas may be nitride, oxide, arsenide, or phosphide. The flow of the reactive gas to the vacuum chamber used to react with the sputtered Group III or Group IV target material for produce the Group III/IV Compound layer onto the template is modulated during a duty cycle during the PVD sputtering process between a target-rich condition and a reactive gas-rich condition to enhance the efficiency of the PVD sputtering process and improve the crystallinity of the Group III/IV Compound layer within the resulting semiconductor structure.

7 Claims, 11 Drawing Sheets

Related U.S. Application Data

(60) Provisional application No. 63/152,531, filed on Feb. 23, 2021, provisional application No. 63/141,785, filed on Jan. 26, 2021, provisional application No. 63/121,620, filed on Dec. 4, 2020.

(51) Int. Cl.

| | |
|---|---|
| *C30B 29/40* | (2006.01) |
| *H01L 21/02* | (2006.01) |
| *H10H 20/01* | (2025.01) |
| *H10H 20/812* | (2025.01) |
| *H10H 20/825* | (2025.01) |
| *H10H 20/832* | (2025.01) |

(52) U.S. Cl.
CPC ........ *H10H 20/812* (2025.01); *H10H 20/825* (2025.01); *H10H 20/835* (2025.01)

(56) References Cited

U.S. PATENT DOCUMENTS

| | | | | |
|---|---|---|---|---|
| 4,833,103 | A | 5/1989 | Agostinelli et al. | |
| 5,980,707 | A * | 11/1999 | Manley .............. | H01J 37/3408 |
| | | | | 204/192.12 |
| 2002/0009621 | A1 * | 1/2002 | Finely ................ | C23C 14/5806 |
| | | | | 204/192.15 |
| 2015/0354052 | A1 * | 12/2015 | Bugyi .................. | C23C 14/548 |
| | | | | 204/192.15 |
| 2017/0345642 | A1 | 11/2017 | Jorgensen et al. | |

OTHER PUBLICATIONS

Machine Translation DE 102004006530 A1 (Year: 2004).*
Sarakinos et al. "High power pulsed magnetron sputtering: a review on scientific and engineering state of the art", Surface & Coatings Technology 204 (2010) 1661-1684 (Year: 2010).*

* cited by examiner

68 — SPUTTERED GaN , THICKNESS = Z

66 — SPUTTERED GaN , THICKNESS = Y

64 — SPUTTERED ALUMINUM NITRIDE (AlN) , THICKNESS = X

62 — SUBSTRATE

150

FLUX OF ATOMS IMPINGING ON A
SUBSTRATE WITH PROPER
CRYSTALLOGRAPHIC STRUCTURE
AND ORIENTATION

152

154a

154b

2D ISLAND GROWTH

156a

156b

3D ISLAND GROWTH

158a

158b

STEP-FLOW GROWTH

160

$$\text{Duty cycle} = \frac{\text{T-on}}{\text{T-off} + \text{T-on}}$$

REACTIVE GAS MODULATION FOR GROUP III/IV COMPOUND DEPOSITION SYSTEMS

CROSS-REFERENCE TO RELATED APPLICATIONS

This application claims priority benefit to U.S. Provisional Application Nos. 63/121,620 filed on Dec. 4, 2020, 63/141,785 filed on Jan. 26, 2021, and 63/152,531 filed on Feb. 23, 2021, each entitled "Array Stamps By Cool Growth," as well as it is a continuation-in-part of U.S. Ser. No. 17/520,691 filed on Nov. 7, 2021, entitled "Method and Apparatus for Micro-LED Array and Active Matrix, all of which are hereby incorporated by reference in their entirety.

This application is related to prior:

U.S. Ser. No. 15/294,558, entitled "System and Method for Light-Emitting Devices on Lattice-Matched Metal Substrates" filed on Oct. 14, 2016, and published as Application Publication US 2017/0110626 on Apr. 20, 2017;

U.S. Provisional Application No. 62/242,604, titled "Method and Hyper Emission Green Light-Emitting Diode on Lattice-Matched Metal Substrates for Advanced Optical Fiber Networking" filed on Oct. 16, 2015;

each of which is hereby incorporated by reference in its entirety.

This application is also related to prior:

U.S. Provisional Application No. 60/835,934, entitled "III-Nitride Light-Emitting Devices with One or More Resonance Reflectors and Reflective Engineered Growth Templates for Such Devices, and Methods" filed on Aug. 6, 2006;

U.S. Provisional Application No. 60/821,588, entitled "III-Nitride Light-Emitting Devices with One or More Resonance Reflectors and Reflective Engineered Growth Templates for Such Devices, and Methods" filed on Aug. 7, 2006;

U.S. Provisional Application No. 61/066,960, entitled "Current-Injecting/Tunneling Light Emitting Device and Method" filed on Feb. 25, 2008;

U.S. Provisional Application No. 61/610,943, entitled "Metallo-Semiconductor Structures for III-Nitride Devices" filed on Mar. 14, 2012;

U.S. Provisional Application No. 61/623,885, entitled "Structures for III-Nitride Devices" filed on Apr. 13, 2012;

U.S. Provisional Application No. 61/655,477, entitled "Metal-Base Transistors for III-Nitride Devices" filed on Jun. 4, 2012;

U.S. Pat. No. 7,915,624 issued on Mar. 29, 2011, entitled "III-Nitride Light-Emitting Devices with One or More Resonance Reflectors and Reflective Engineered Growth Templates for Such Devices, and Methods;"

U.S. Pat. No. 8,253,157 (a divisional of the application that is now U.S. Pat. No. 7,915,624) issued on Aug. 28, 2012, entitled "III-Nitride Light-Emitting Devices with Reflective Engineered Growth Templates and Methods of Manufacture;"

U.S. Pat. No. 8,890,183 (a divisional of the application that is now U.S. Pat. No. 8,253,157) issued on Nov. 18, 2014, entitled "III-Nitride Light-Emitting Devices with Reflective Engineered Growth Templates and Manufacturing Method;"

U.S. Pat. No. 7,842,939 issued on Nov. 30, 2010, entitled "Current-Injecting/Tunneling Light Emitting Device and Method;"

U.S. Pat. No. 8,865,492 (a divisional of the application that is now U.S. Pat. No. 7,842,939) issued on Oct. 21, 2014, titled "Method of Forming Current-Injecting/Tunneling Light Emitting Device;" and U.S. Pat. No. 9,608,145 issued on Mar. 28, 2017, entitled "Materials, Structures, and Methods for Optical and Electrical III-Nitride Semiconductor Devices,"

each of which is incorporated herein by reference in its entirety.

FIELD OF INVENTION

This invention relates to the field of semiconductor devices and methods of manufacturing therefore, and more specifically to methods for growing more efficiently Group III/IV Compound-based semiconductor devices.

BACKGROUND OF THE INVENTION

A semiconductor is a material that conducts electric current better than insulators like glass, but not as well as conductors like copper. Such semiconductive materials have made possible modern computers and many other devices like light-emitting devices, laser diodes, transistors, radiation detectors, sensors, and solar cells.

Silicon is the most widely used semiconductor material. However, other important materials for semiconductors include cuprous oxide, germanium, gallium arsenide, gallium phosphide, indium arsenide, lead sulfide, selenium, and silicon carbide.

Such semiconductor devices exhibit a number of advantages over the vacuum and gas-filled tubes that preceded them in the electronics industry. For example, semiconductor devices use much less power than tubes, they last longer, and they can be built much smaller.

In ordinary copper wire, the copper atoms have electrons that freely move from atom to atom. This flow of electrons produces an electrical current.

In an ideal state, semiconductor materials would constitute insulators, because they would be characterized by no free electrons. But if very small amounts of dopant impurities like antimony, arsenic, or phosphorous are introduced into the semiconductor material, then a few free electrons are produced that can move within the material to produce electric current. Such a semiconductor material is known within the industry as a "n-type semiconductor."

However, if small quantities of other dopant impurities like aluminum, boron, or gallium are added to the semiconductor material, electrons will be taken away from a few atoms to produce a "hole." The hole can be passed from atom to atom within the semiconductor. The flow of such holes forms an electric current. This is called a "p-type semiconductor."

Semiconductor diodes allow electric current to flow in only one direction and are used as rectifiers. They contain a piece of gallium arsenide, germanium, or silicon with a n-type region and a p-type region with a p-n junction where they meet. When the p-type region has a positive charge and the n-type region has a negative charge, the p-type region within the semiconductor will attract electrons from the n-type region, and the n-type region will attract holes from the p-type region. Thus, electric current will flow across the p-n junction within the semiconductor diode. But if the p-type region is made negative and the n-type region is made positive, almost no current will flow across the p-n junction.

Light-emitting semiconductor lamps include tiny gallium phosphides diodes that produce light under little electric power. A light-emitting diode ("LED") is a semiconductor light source that emits light when electric current flows through it. Electrons in the semiconductor material recombine with the electron holes contained therein, thereby releasing energy in the form of photons. The color of the resulting light corresponding to the energy of these photons is determined by the energy required for the electrons to cross the band gap within the semiconductor.

LED semiconductors exhibit many advantages over traditional incandescent lamps. These advantages include lower power consumption so that they operate at cooler temperatures, longer lifetime, improved physical robustness, smaller size, and faster switching.

The first visible-spectrum red LED was demonstrated in the United Kingdom in 1961, based upon a gallium arsenide (GaAs) semiconductor alloy. Monsanto mass produced red LEDs incorporating GaAsP in 1968 which became the choice for number indicator displays in calculators and other machines where brightness and size were not an issue.

The first blue LED using magnesium-doped gallium nitride (GaN) was developed in the U.S. in 1972. Key breakthroughs in GaN epitaxial growth and p-type doping in the late 1980's enabled Shuji Nakamura to develop a high-brightness blue LED in 1993 for which he subsequently won a Nobel Prize in Physics.

Epitaxial growth methods for GaN-based compounds have enabled the improvement of manufacturing processes for LEDs. For example, green LEDs are now typically based upon indium gallium nitride (InGaN)/GaN layered fibers, instead of the non-nitride material systems from which they were formerly made. White LEDs typically use in combination multiple LED semiconductor clips emitting red, green, and blue wavelengths.

However, it would be highly beneficial to develop further improvements to the manufacturing processes and structures of GaN-based and other Group III/IV Compound-based film layered systems that enable brighter, smaller, more robust and reliable colored LEDs that require less power to operate and are cheaper to manufacture. Such improvements would expand the end-use applications for LEDs in a variety of industrial and consumer electronics products.

SUMMARY OF THE INVENTION

A process for producing semiconductor structures comprising one of more layers of Group III/IV Compounds deposited onto a template using PVD sputtering the resulting semiconductor structures is provided according to the invention. The Group III or Group IV material may be gallium, hafnium, indium, aluminum, silicon, germanium, magnesium and/or zirconium. The anion provided by a reactive gas may be nitride, oxide, arsenide, or phosphide. The flow of the reactive gas to the vacuum chamber used to react with the sputtered Group III or Group IV target material for produce the Group III/IV Compound layer onto the template is modulated during a duty cycle during the PVD sputtering process between a target-rich condition and a reactive gas-rich condition to enhance the efficiency of the PVD sputtering process and improve the crystallinity of the Group III/IV Compound layer within the resulting semiconductor structure.

BRIEF DESCRIPTION OF THE DRAWINGS

In the accompanying drawings:

FIG. 2 is a schematic diagram of a system for growing GaN-based devices.

DETAILED DESCRIPTION OF THE PREFERRED EMBODIMENT

Figure 1:
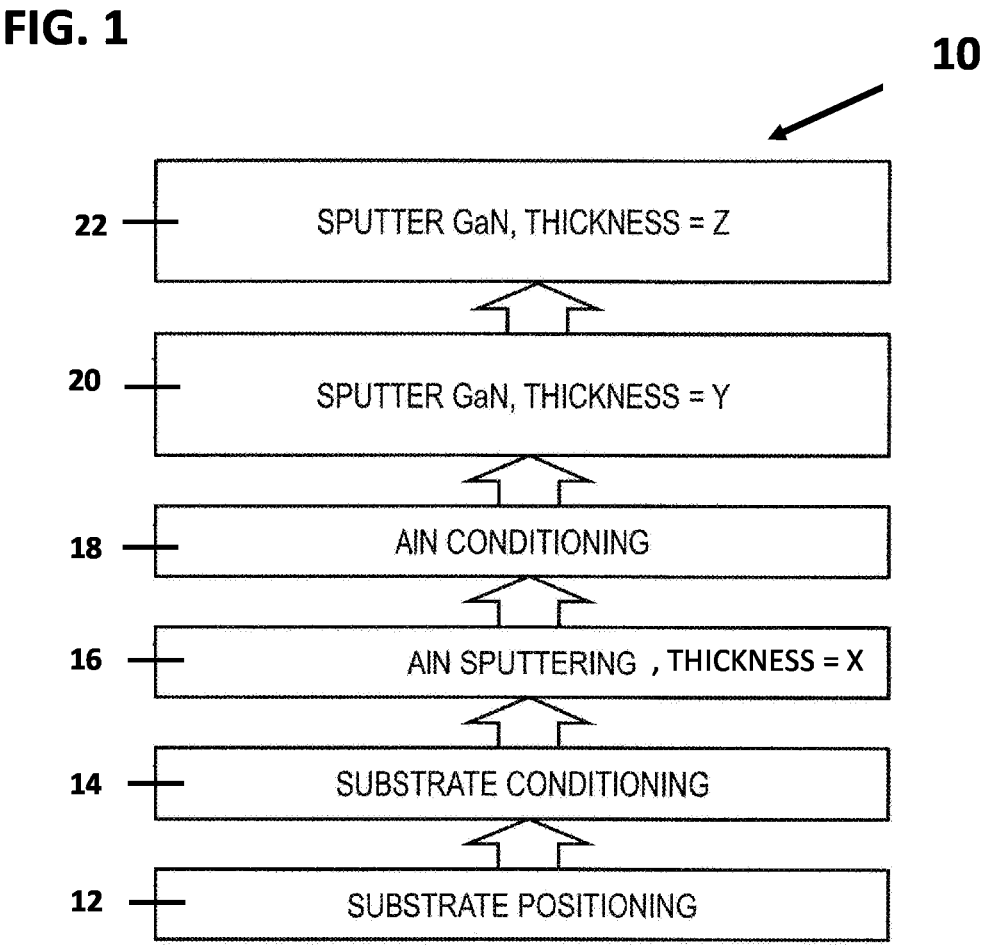
FIG. 1 is a flowchart of a method for growing gallium nitride ("GaN")-based devices.

A process for producing semiconductor structures comprising one of more layers of Group III/IV Compounds deposited onto a template using PVD sputtering the resulting semiconductor structures is provided according to the invention. The Group III or Group IV material may be gallium, hafnium, indium, aluminum, silicon, germanium, magnesium and/or zirconium. The anion provided by a reactive gas may be nitride, oxide, arsenide, or phosphide. The flow of the reactive gas to the vacuum chamber used to react with the sputtered Group III or Group IV target material produce the Group III/IV Compound layer onto the template is modulated during a duty cycle during the PVD sputtering process between a target-rich condition and a reactive gas-rich condition to enhance the efficiency of the PVD sputtering process and improve the crystallinity of the Group III/IV Compound layer within the resulting semiconductor structure.

As used in this Application, the term "substrate" means a material upon which an epitaxial growth process is conducted. Suitable substrates include silicon, sapphire, or other suitable materials.

For purposes of this invention, the term "template" means one or more layers that form a base suitable for epitaxial growth. Suitable templates include silicon, sapphire, GaN/silicon, GaN/sapphire, GaN/Aluminum Nitride (AlN), GaN/Hafnium Nitride (HfN), GaN/Zirconium Nitride (ZrN), or any other suitable materials, structures, pattern templates, or substrates.

As used herein, the term "epitaxial" refers to a material state (i.e., not a process) of inorganic materials based on the materials' electrical or electrical and optical relationship with other inorganic materials that it is physically in contact with (typically layered), such that the materials are substantially lattice matched (i.e., the atomic lattices of the two or more materials line up in a predictable and organized repeating atomic lattice structure), and that the materials are substantially single crystal—i.e., the strain of the lattice mismatch and layer thickness (1) does not generate undesired cracking within the device, (2) does not generate dislocations with densities large enough and/or of the type to result in undesired electrical shorting of the device such that the device cannot be useful, and (3) does not generate a secondary material phase (e.g., inclusions, precipitates, poly-crystal grains, and/or multi crystal grains) such that the device is not useful).

In addition, as one of skill in the art would understand, carbon-containing compounds, such as carbides, carbonates, simple oxides of carbon (e.g., CO and $CO_2$), and cyanides, as well as the allotropes of carbon (e.g., diamond and graphite), are considered to be inorganic materials.

As used in this Application, the term "Group III/IV Compounds" means nitride, oxide, arsenide, or phosphide compounds for which the Group III or Group IV metal cation is gallium (Ga), indium (In), aluminum (Al), silicon (Si), germanium (Ge), magnesium (Mg), Hafnium (Hf), or zirconium (Zr).

For purposes of this invention, "Group III/IV target" means the element or combination of elements that are selected from the Group III/IV periodic elements to be sputtered under the PVD sputtering process of the present invention to produce the Group III/IV Compound material, including but not limited to gallium (Ga), indium (In), aluminum (Al), silicon (Si), germanium (Ge), magnesium (Mg), Hafnium (Hf), and/or zirconium (Zr).

As used in this Application, "reactive gas" means the gas that is introduced to the PVD sputtering vacuum chamber to react with the sputtered Group III/IV target to produce the Group III/IV Compound, including but not limited to nitrogen ($N_2$), oxygen ($O_2$), the precursor for arsenide ($As^{-3}$), or the precursor for phosphide ($P^{-3}$).

As used herein, physical vapor deposition ("PVD") describes deposition methods that can be used to produce thin films and coatings, including cathode arc deposition, electron-beam PVD, evaporative deposition, pulsed-laser deposition, and sputtering.

For purposes of this invention, "sputtering" includes one or more of the following: direct current (DC) sputtering, radio frequency (RF) sputtering, reactive sputtering, and magnetron sputtering.

As used in this Application, the term "Epitaxial Growth Products" means semiconductor products produced by a PVD process, especially by means of sputtering, that functions as a light-emitting device like a light-emitting diode ("LED"), laser diode, transistor, detector, sensor, etc.

Such Epitaxial Growth products are fabricated by depositing their film layers of Group III/IV Compounds sequentially onto a substrate. Moreover, some Epitaxial Growth Products require a sandwich construction formed from alternating layers of different chemical components like GaN, HfN, or AlN.

FIG. 1 represents a flowchart of a method 10 for growing GaN-based devices. In some embodiments, the method 10 is performed within a single deposition chamber. In other embodiments, method 10 is performed in a plurality of separate deposition chambers. Method 10 includes any one or more of steps 12-22 (for example, in some embodiments, steps 14 and 18 are optional). In step 12, a substrate (e.g., sapphire or silicon) is positioned for subsequent deposition. In step 14, a substrate conditioning is performed. In step 16, AlN is sputtered onto the substrate, where X represents the thickness of the sputtered AlN material. In step 18, AlN conditioning is performed to remove oxides. In step 20, GaN is sputtered onto the AlN layer, where Y represents the thickness of the sputtered GaN material. In some such embodiments, the GaN sputtering includes doping (e.g., doping with silicon, magnesium, iron, carbon, or the like) and/or increased adatom mobility. In step 22, a second layer of GaN is sputtered onto the first GaN layer, wherein Z represents the thickness of the this second sputtered GaN layer. In some such embodiments, the GaN sputtering includes doping (e.g., doping with silicon, magnesium, iron, carbon, or the like) and/or increased adatom mobility (sometimes referred to herein as EALS). In some embodiments, the GaN is alloyed with scandium, zirconium, hafnium, indium, aluminum, or any other suitable element.

Figure 2:
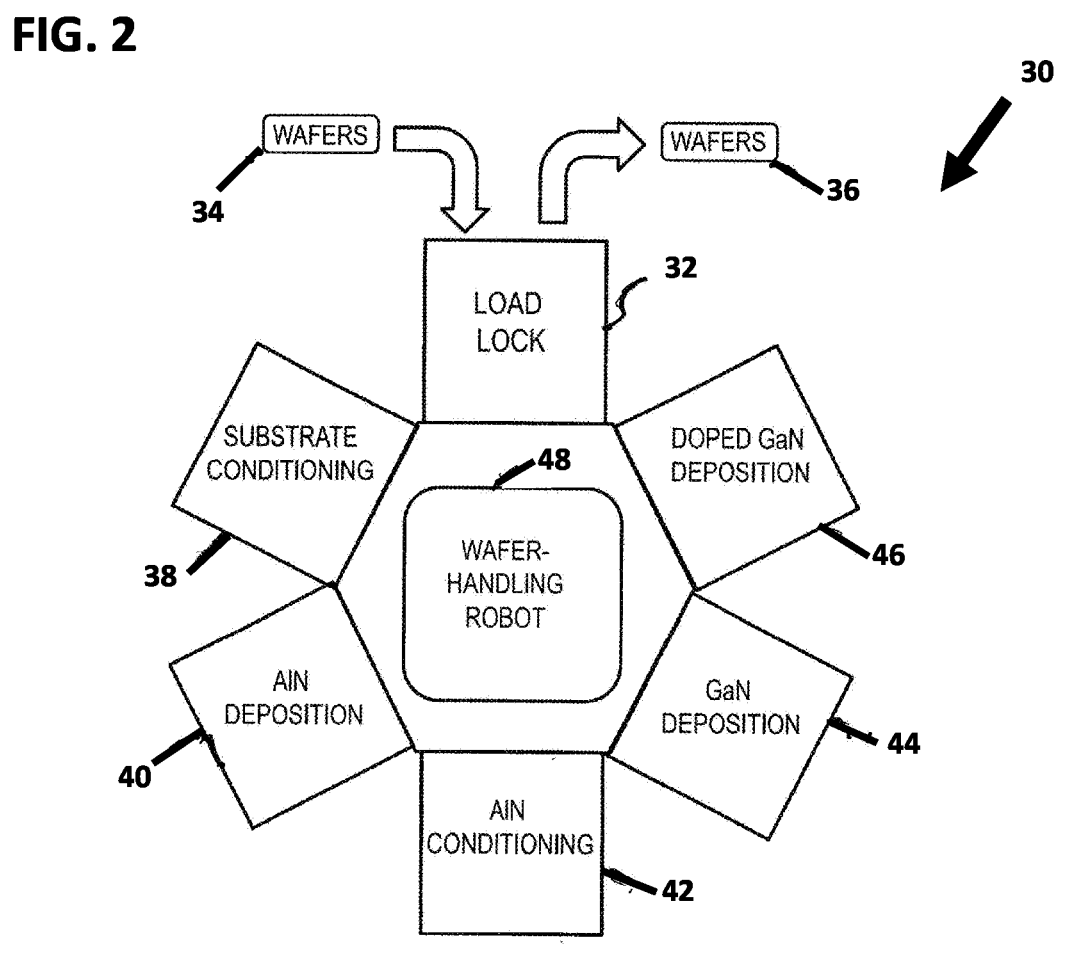

FIG. 2 represents a schematic diagram of a system 30 for growing GaN-based devices. In some embodiments, system 30 is used to perform the method of FIG. 1. System 30 includes a load lock 32 where substrate wafers 34 are loaded into and finished wafers 34 are removed from system 30. System 30 includes a substrate-conditioning module 38 (e.g., a module for performing step 14 of FIG. 1), an AlN-deposition module 40 (e.g., a module for performing step 16 of FIG. 1), an AlN-conditioning module 42 (e.g., a module for performing step 18 of FIG. 1), a GaN-deposition module 44 (e.g., a module for performing step 20 of FIG. 1), and a doping module 46 for doped GaN deposition. In some embodiments, modules 32-46 are contained within a single deposition chamber. In other embodiments, each of modules 32-46 is a separate deposition chamber. In some embodiments, system 30 includes a wafer-handling robot 48 for moving the wafer from module to module within system 30.

Figure 3:
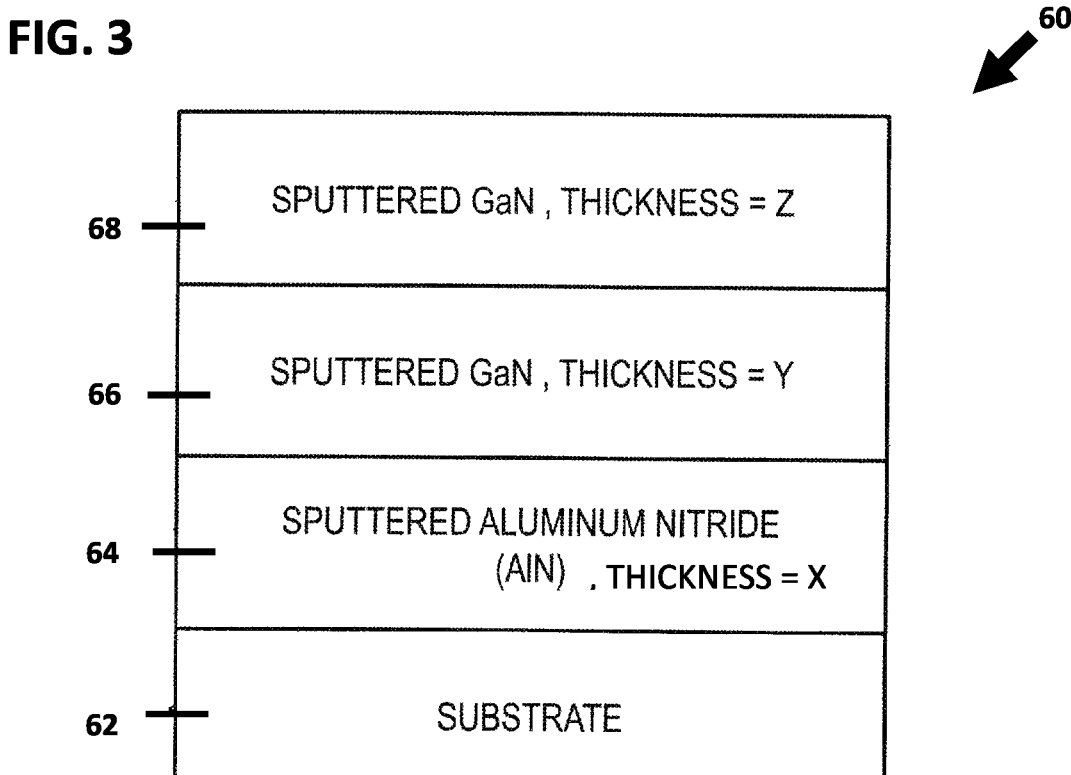
FIG. 3 is a schematic diagram of a GaN structure.

FIG. 3 represents a schematic diagram of a GaN structure 60. In some embodiments, GaN structure 60 is produced by using system 30 of FIG. 2 and/or method 10 of FIG. 1. GaN structure 60 includes a substrate layer 62, a sputtered AlN layer 64 onto substrate layer 62 (in some such embodiments, the thickness of AlN layer 64=X), and sputtered GaN layer 66 onto AlN layer 64 where the thickness of GaN layer 66=Y. In some such embodiments, GaN layer 66 is doped (e.g., doped with silicon, magnesium, or the like). A second sputtered GaN layer 68 may be sputtered onto first GaN layer 66 where the thickness of GaN layer 68=Z. In some such embodiments, GaN layer 68 is doped (e.g., doped with silicon, magnesium, or the like).

Conventional industry systems produce GaN-based devices using metal-organic chemical vapor deposition (MOCVD) for the growth of the GaN layers. Under the present invention, sputtering of Group III/IV Compounds is generally used instead of MOCVD, especially for GaN film layers. Sputtering processes like PVD allow for lower wafer bow and thus better wafer/device uniformity due to the sputtering, lower process temperature, and less costly chemical usage of $NH_3$ and $Ga(CH_3)_3$ and the like. In some embodiments, sputtering processes are also more simply employed and less costly than molecular beam epitaxy ("MBE") processes due to less complex equipment requirements.

Figure 4:
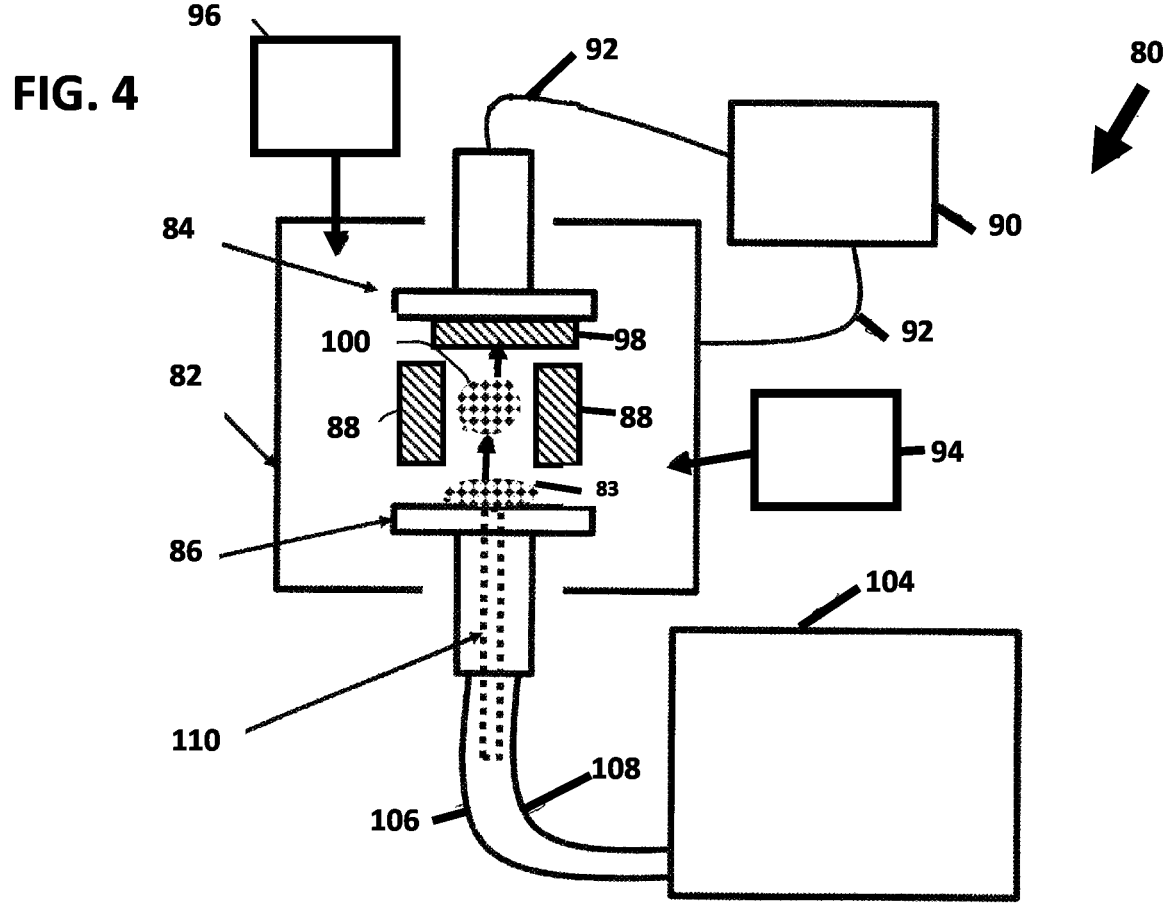
FIG. 4 is a schematic diagram of a low-temperature Group III/IV Compound sputtering system.

FIG. 4 represents a schematic diagram for a PVD sputtering system 80 for Group III/IV Compounds. Sputtering system 80 includes a vacuum chamber 82. Inside the vacuum chamber is a wafer holder 84 and a sputtering gun cathode 86. Two anodes 88 are positioned inside vacuum chamber 82 above the cathode 86. Voltage supply 90 supplies electrical current to anodes 88 via wires 92. Meanwhile, an inert gas like argon (Ar) is fed into the vacuum chamber 82 above cathode 86 from a supply tank 94. A separate supply tank 96 provides a gas corresponding to the anion portion of the Group III/IV Compound (e.g., nitride (N), oxide (O), arsenide (Ar), or phosphide (P) that is introduced into the upper portion of the vacuum chamber 82.

Elements like Hf and Al that are naturally solid at room temperature can be readily deposited onto the substrate wafer by means of this PVD sputtering process. In this PVD process, the target Group III/IV material 83 like Hf or Al positioned on top of cathode 86 is essentially vaporized and deposited as a thin film onto the substrate wafer 98 secured by wafer holder 84 contained inside the vacuum chamber 82. The atoms of the inert gas like argon are bombarded by electrons passing between the electrically negatively charged anode 88 and the cathode 86, thereby prompting the resulting positively charged Ar cations to bombard the target material 83 that is placed on top of the cathode inside the chamber. Small molecules 100 of the Hf or Al material are released inside the vacuum chamber 82 to "sputter" (i.e., spray) towards the lower surface of substrate 83. Meanwhile, the reactive gas 96 like nitrogen ($N_2$) mixes with these small HF or Al molecules 100 to form a plasma of HfN or AlN that rises inside the vacuum chamber to form the resulting film layer on the substrate wafer. This sputtering process was known within the industry to create accurate and even distributions of the films of the reactive HfN or AlN compound, and it allows for a variety of target materials.

However, Ga is naturally a liquid near room temperature. It was thought in the industry and research community, therefore, that gallium compounds like GaN could not be deposited onto a substrate by means of magnetron sputtering with a Ga target. Liquid Ga accumulates Ar during the PVD sputtering process, thereby causing bubbles and eventual spitting of Ga droplets onto the wafers. Instead, alternative techniques like molecular beam epitaxy, metal organic chemical vapor deposition, reactive pulsed laser, or hybrid vapor epitaxy deposition were previously employed within the industry and research community for the deposition of GaN or other Ga-containing compounds. But, this necessarily required a manufacturer to alternate between different deposition processes like magnetron sputtering and molecular beam epitaxy, metal organic chemical vapor deposition, reactive pulsed laser, or hybrid vapor epitaxy deposition to build, e.g., an alternating HfN—GaN—HfN—GaN sandwich for an semiconductor electrical device, since HfN films are best made by sputtering. Use of multiple deposition technologies increased manufacturing costs and increased complexity within the manufacturing process.

Thus, the PVD sputtering process 10 of the present invention may apply a low-temperature chiller 104 to circulate one or more heat-transfer fluids through lines 106 and 108 to the cathode 86 in the magnetron sputtering gun to significantly reduce the temperature of the liquid Ga material 83 to be placed in a cup onto the upper cathode surface to turn it in a solid state before the sputtering process is commenced. Such heat transfer fluid may comprise a cryogenic fluid like liquid nitrogen or liquid hydrogen, one or more alcohols, or other suitable heat-transfer fluids. In some embodiments, liquid nitrogen and/or liquid hydrogen is used when sputtering system 80 is used with large wafer and/or wafer platter production systems. But this idea requires a sputtering gun 86 capable of operating at a low temperature below about 14° C., preferably to a very-low temperature below 0° C., even more preferably on the order of −45° C. for the Ga target. Moreover, because of these very low temperatures, the normal rubber seals contained in a sputtering gun would be inadequate. Therefore, sputtering gun 86 may be equipped with all-metal seals and other suitable components capable of operating at around −45° C. that would be required to perform this very-low temperature to maintain the Ga target in a solid state during the sputtering process required for GaN deposition.

In some embodiments, the voltage from voltage supply 90 is increased as the wafer-size increases. In some embodiments, system 80 also includes an optical path 110 for in situ closed or open process monitoring. Path 110 is operatively coupled to a pyrometer and/or an optical reflectivity system that is computer corrected for emissivity.

The GaN growth processes/systems described herein are complementary to epitaxial atomic layer sputtering (EALS). EALS is a process that results in effectively stoichiometric epitaxial growth of a metal-nitride compound material upon a substrate using sputtering or reactive sputtering where the ratio of the metal (e.g., Ga) to active nitrogen (N) atoms arriving at the surface of the metal nitride being formed is periodically varied between metal-rich to N-rich conditions as compared to the stoichiometric composition of the metal-nitride compound. In some embodiments, this process of switching from metal-rich conditions to metal-lean conditions is accomplished by: (1) reducing the metal flux to the surface of the metal nitride being formed, or (2) increasing the active nitrogen flux, or (3) increasing the temperature of the substrate (or exposing the surface of the metal nitride being formed) to increase evaporation rate (i.e., lower the residence time) of the metal adatoms, or any combination of (1)-(3). In some embodiments, the metal-rich conditions increase the mobility of adatom by reducing the effect of unsatisfied (or dangling) bonds at the surface to enhance surface migration, which results in non-columnar step growth and thus higher-quality and smoother films. In general, increased surface migration of adatoms improves crystal quality of the deposited materials by assisting the adatoms to incorporate in low-energy sites on the growth front. Similarly, in some embodiments, increasing the surface temperature or applying low-energy ions can increase surface migration of adatoms to improve thin film quality. Accordingly, in some embodiments of the present invention, the EALS process is used that may include a separate nitrogen plasma source (e.g., a radio frequency ("RF") nitrogen source) or even ion beam-assisted deposition.

Figure 5:
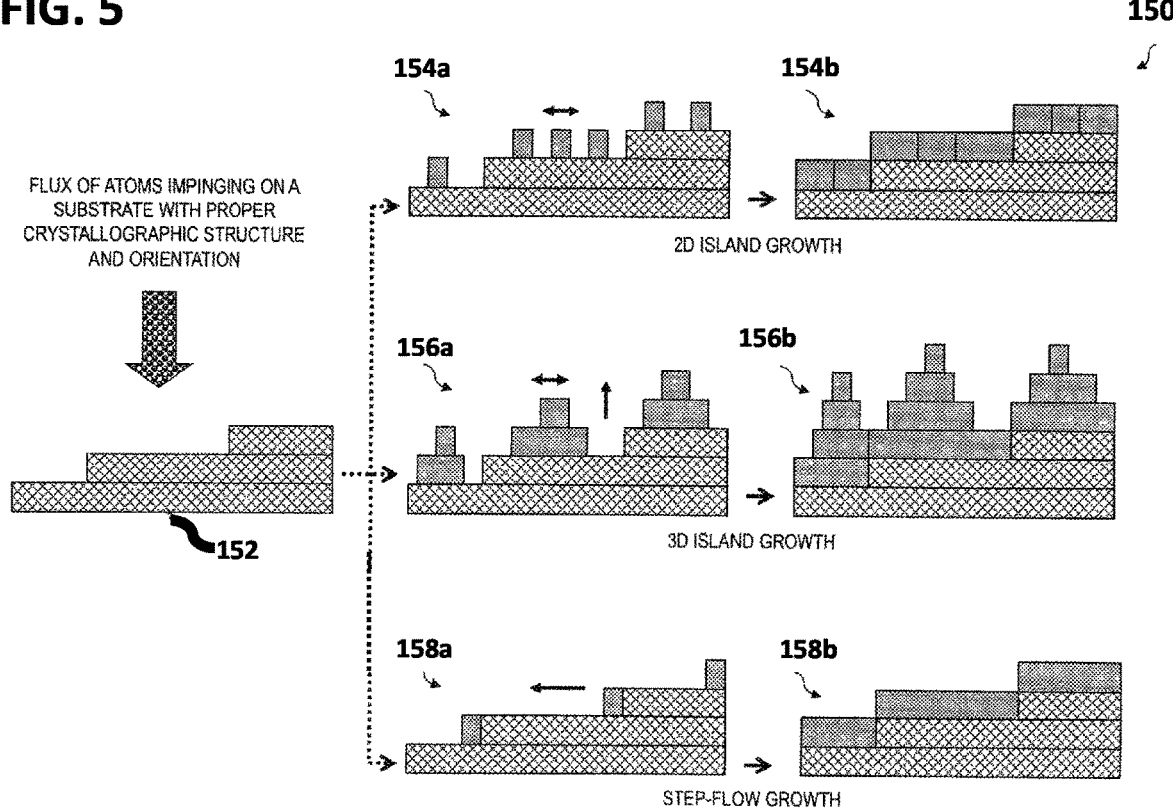
FIG. 5 is a series of schematic diagrams illustrating a plurality of different epitaxial growth modes for according to some of the embodiments of the present invention.

FIG. 5 is a schematic diagram that illustrates a plurality 150 of different epitaxial growth modes according to some embodiments of the present invention. In epitaxial film growth, deposited material(s) ideally form ordered crystals with atomic arrangement and orientation that are determined by the crystallographic structure of the substrate 152. In some embodiments of the present invention, depending upon the surface mobility of arriving atoms and the properties of the substrate and epitaxial film, different growth modes 154, 156, and/or 158 are obtained. Depending upon the surface mobility of the arriving atoms on the substrate surface, and other factors such as average terrace length of surface steps, crystal orientation and defect density of substrate, surface and interface energetic, lattice mismatch between film and substrate, the epitaxial growth process: (1) starts and progresses in one of the above modes, (2) is a mixture of two or more modes, or (3) starts in one mode and then transitions to another mode or a mixed growth mode.

In some embodiments, growth mode 154 (represented by the progression from 154*a* to 154*b*) is referred to as two-dimensional "2D" island growth. In some embodiments, in mode 154, small islands nucleate over the surface and laterally grow to coalesce into a layer, thereby resulting in many grain boundaries. In some embodiments, growth mode 156 (represented by the progression from 156a to 156b) is referred to as three-dimensional "3D" island growth. In some embodiments, in mode 156, small islands nucleate over the surface and grow while more islands are formed on top of earlier islands before the bottom layers are completed, thereby resulting in increased surface roughness (in some embodiments, mode 156 includes columnar growth). In some embodiments, growth mode 158 (represented by the progression from 158a to 158b) is referred to as step-flow growth. In some embodiments, in mode 158, atoms arriving on the surface migrate and incorporate at step edges to complete layers by step flow. In some embodiments, mode 158 occurs when the surface diffusion is large compared to average terrace length.

U.S. Pat. No. 10,170,303 and U.S. Ser. No. 16/234,070 owned by the inventor of this Application disclose more fully aspects of the PVD sputtering process 10 of the present invention. They are hereby incorporated by reference in their entirety.

Figure 6:
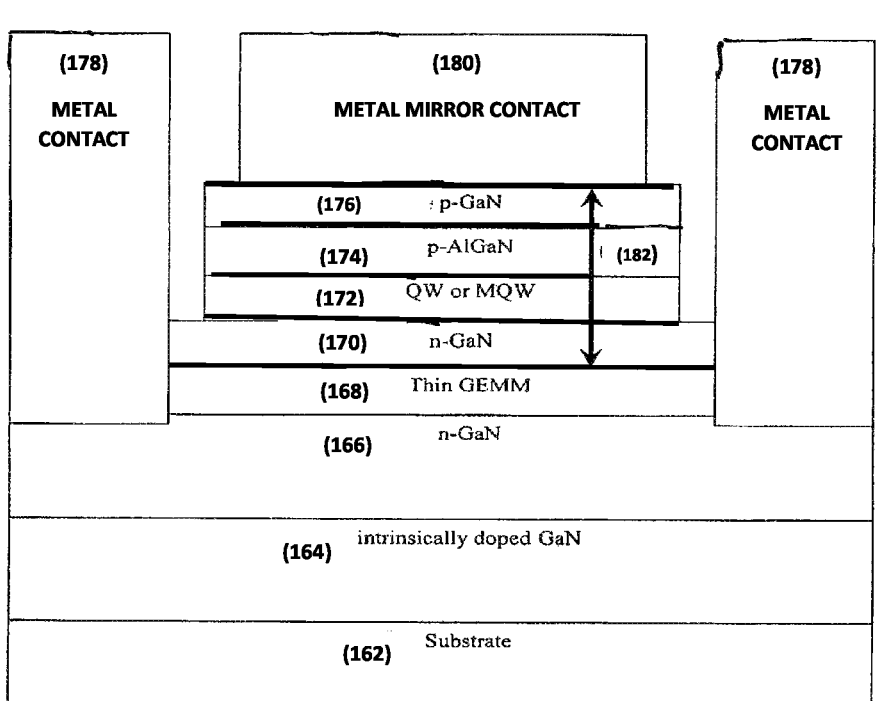
FIG. 6 illustrates a Group III-nitride Resonant Cavity LED (also known as a microcavity LED) with GEMM and a non-epitaxial metal mirror for enhanced light extraction according to one of the embodiments of the invention.
Figure 6:

Many efforts have been made by the inventor of this Application to improve the structures for Epitaxial Growth Products made from Group III/IV Compounds in order to enhance their ability, e.g., to emit bright light in a reliable and focused fashion, while enabling the structure of the resulting LED device to be made smaller and more cheaply. For example, as disclosed more fully within U.S. Pat. Nos. 7,915,624; 8,253,157; and 8,890,183 which are hereby incorporated by reference in their entirety, a grown-epitaxial-metal mirror ("GEMM") in the form of a GEMM layer and a separate non-epitaxial metal mirror may be added to the structure of the LED semiconductor that define an optical cavity therebetween. Such a structure 160 is shown in FIG. 6.

The GEMM (168) lends itself to many forms of optical cavity semiconductor light emitters. For example, the GEMM (168), with its highly reflective bulk properties, may be grown thin such that the GEMM (168) is partially transparent and partially reflective. A planar Group III/IV-nitride material growth template comprised of sapphire substrate (162), intrinsically-doped GaN buffer layer (164), and an n-GaN layer (166) of device quality are used so that the crystal quality of the GEMM (168) is planar, specular and of device quality. The GEMM (168) is lattice matched to the n-GaN layer (166) such that the desired thickness may be below the epitaxial critical thickness.

Once the 21.tm initially-doped GaN buffer (164) and the 2 gm n-GaN (166) layers are grown on a sapphire substrate (162), the GEMM (168) may be grown to a specific thickness (−20 nm) for the resonant cavity (182) such that the GEMM is partially reflective and partially transparent. Once the GEMM (168) is grown on the n-GaN layer (166), the second n-GaN layer (170) may then be grown to a specific thickness (−1200 A) that is optimal for the resonant cavity (182) being that the active region (172) may be positioned at or close to an antinode being a maximum of the optical field within a width of 0.25 $VN_{GaN}$. $N_{GaN}$ is the index of refraction; X is the emission wave length in vacuum.

In this embodiment, the illustrated RCLED may emit at a wavelength of 500 nm with a cavity length (182) of about 3000 A (being within the microcavity regime). The light generated in the active region (172) resonates between the thick, highly reflective non-epitaxial metal mirror (180) and the thin, partially reflective, partially transparent, GEMM (168). The cavity is such that the mirrors (168) (180) are spaced apart such that light generated by the active region (172) may resonate between the mirrors. The mirrors (168)

(180) are spaced apart such that an integer number of half wave lengths of the light generated by the active region (172) may fit between the mirrors (168) (180) within the nitride materials. The active region (172) is placed in between the mirrors such that the generated light constructively interferes with the reflected light from both mirrors (168) (180). The resonating light exits the GEMM (168) side of the device through the sapphire substrate (162), as shown in FIG. 6.

Likewise, as disclosed more fully within U.S. Pat. Nos. 7,842,939 and 8,865,492 which are hereby incorporated by reference in their entirety, a LED semiconductor having an active region may include a tunnel-barrier ("TB") structure facing adjacent to the active region, and a TB-grown-epitaxial, metal-mirror ("TB-GEMM") structure facing adjacent to the TB structure, whereupon the TB-GEMM structure includes at least one metal that is substantially lattice matched to the active region, and a conductivity-type Group III-nitride crystal structure adjacent facing the active region opposite to the TB structure.

Figure 7:
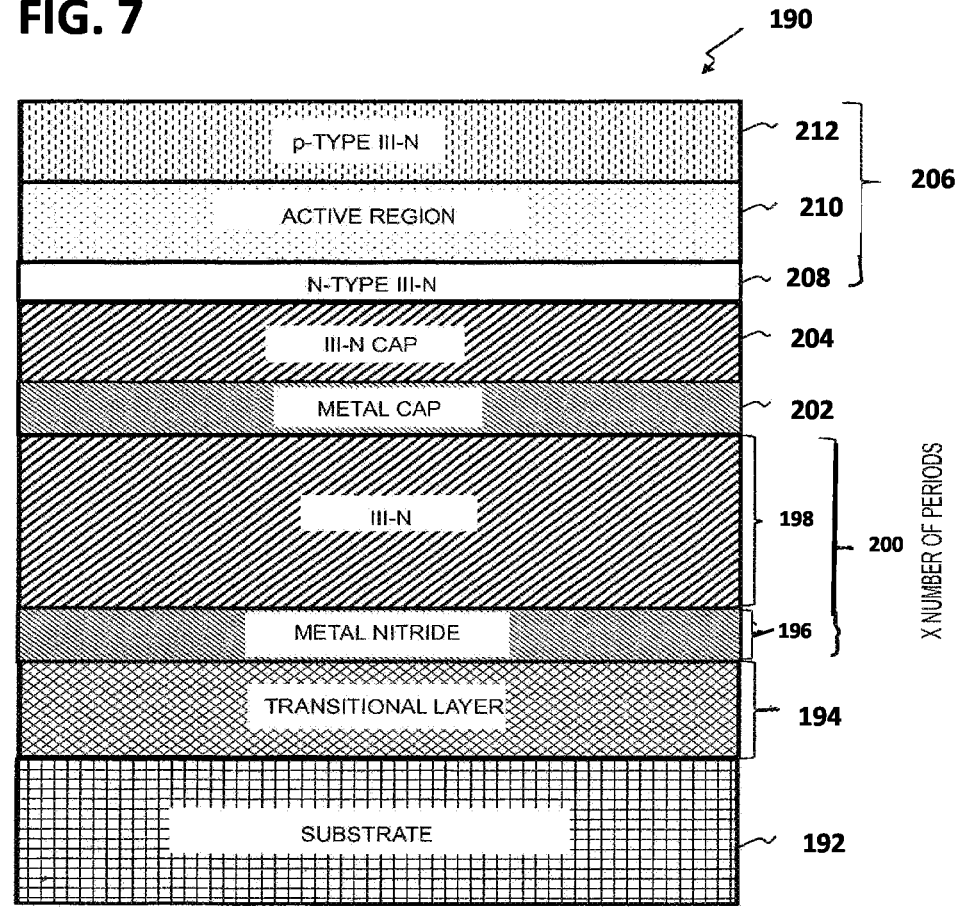
FIG. 7 is a block diagram of a semiconductor device structure that includes a multi-layer metallo-semiconductor structure according to one of the embodiments of the invention.

As disclosed more fully within U.S. Pat. Nos. 9,608,145 and 9,978,894 and U.S. Ser. No. 15/985,466, which are hereby incorporated by reference in their entirety, Group III-nitride semiconductor devices may include a multi-layer metallo-semiconductor structure (i.e., PhC-GEMM). As shown more clearly in the block diagram of a semiconductor device 190 in FIG. 7, the semiconductor device structure 190 includes substrate 192 (e.g., Si, GaN, sapphire, GaN-on-Sapphire, GaN-on-Si, AlN, AlN-on-sapphire. AlN-on-Si and/or the like as described above), transition layer 194 (e.g., that includes a III-nitride layer or a metal material, each of which are described above) on substrate 192, metal material layer 196 (e.g., elemental metals, composites, and/or compounds that include Ti, Zr, Hf, V, Nb, Ta, Cr, Mo, W. and/or the like as described above) on transition layer 194, III-nitride layer 198 (e.g., GaN, AlN, Si, and/or the like as describe above) on metal material layer 196, wherein metal material layer 196 and III-nitride layer 198 form a single period 200 PhC-GEMM structure, metal cap layer 202 (e.g., that includes a metal material as described above) on PhC-GEMM period 200, III-nitride cap 204 (e.g., that includes a III-nitride material as described above) on metal cap layer 202, and semiconductor device structure 206.

In some embodiments, transition layer 194, III-nitride layer 198, and III-nitride cap 204 include impurity doping (e.g., Si doping for n-type conductivity and Mg doping for p-type conductivity) to increase the electrical conductivity.

Metal layer 196 and III-nitride layer 198 form a single period 200 PhC-GEMM structure for tuning the reflectivity of light incident on the structure. Optionally, in some embodiments, semiconductor device 190 includes a plurality of periods 200 (e.g., up to 20 periods).

The thickness of metal layer 196 may be approximately 20 nm and the thickness of III-nitride layer 198 may be approximately 90 nm. Semiconductor device structure 206 may be an LED device structure and include n-type III-nitride layer 208, active region 210 located on n-type III-nitride layer 208, and p-type III-nitride layer 212 located on active region 210. In some embodiments, active region 210 includes one or more light emitting quantum wells (e.g., InGaN quantum wells (QWs) or multiple-quantum wells (MQW's)).

In some embodiments, substrate 192, transition layer 194, metal material layer 196, III-nitride layer 198, metal cap layer 202, III-nitride cap 204, and semiconductor device structure 206 are each substantially single crystal and substantially lattice matched to each previous and subsequent layer.

But it has also been discovered that the reactive gas 96 like nitrogen should not necessarily be fed to vacuum chamber 82 at a constant rate to react with the Group III/IV target material 83 like Ga or Hf to form the resulting plasma that deposes the GaN or HfN film onto substrate wafer 98 during the PVD sputtering process 10, (see FIG. 4). Rather, it has been discovered under this invention that it is sometimes advantageous to control or modulate the flow of the reactive gas 96 into the vacuum chamber 82 to alternate between a target-rich condition and reactive gas-rich condition. During the target-rich condition, less of the reactive gas will be present at the substrate wafer 98.

During the reactive gas-rich condition, more reactive gas will be present at the substrate wafer 98. The volume of the Group III/IV target material like Ga present on the cathode 86 will not be affected by this modulation. However, in the reactive gas-rich condition state, if nitrogen gas ($N_2$) is the reactive gas used, then the resulting GaN plasma formed inside the vacuum chamber will extend vertically all the way to the wafer substrate 98. Meanwhile, during such Ga-rich condition state, all of the GaN plasma will be restrained from extending vertically to the wafer substrate.

While we use henceforth a "Ga-rich condition" state for the sake of example, it should be understood that for purposes of this invention, the reactive gas modulation principle works for other Group III or Group IV metal elements besides Ga, including Hf, Al, In, Si, Ge, Mg, or Zr. Likewise, the "nitrogen-rich condition" state is used for the sake of example, it should be understood that the reactive gas modulation principle works for other reactive gases besides nitrogen, including oxygen, the precursor of arsenide, or the precursor of phosphide.

For purposes of this invention, the modulation of the reactive gas 96 to the vacuum chamber 82 may be achieved by means of a valve regulated by an automated control system (not shown) that turns the flow completely off, completely on, or to some measurable flow rate in between. Alternatively, a mechanical device like a shutter assembly having a plurality of louvered panels (not shown) may be positioned inside the vacuum chamber 82 above where the plasma forms during the PVD sputtering process. The modulation process would be achieved by automated control of the louvered panels to move them between a completely open position, a completely blocking position that prevents the plasma from further rising to contact the lower surface of substrate wafter 98 to form, e.g., the GaN film layer, or some position in between in which the rise of the plasma is partially reduced to slow the formation of the GaN film layer.

The modulation process for the reactive gas 96 will be carried out during a cycle that encompasses sequentially both the Ga-rich and the nitrogen-rich conditions. Such a cycle could encompass about 1 HZ-16 HZ where 1 HZ=1 cycle/second and 16 HZ=16 cycles/second. Because of the very short time period for these cycles, it will generally be disadvantageous to completely turn off the reactive gas 96 to the vacuum chamber 82 or completely block the plasma from rising above the mechanical shutter inside the vacuum chamber, because there would be insufficient time to turn the flow on again within the remaining portion of the cycle. Therefore, the term "gallium-rich" is generally meant to indicate a condition in which the flow of the reactive gas 96 like nitrogen is reduced or the resulting plasma partially blocked.

Figure 8:
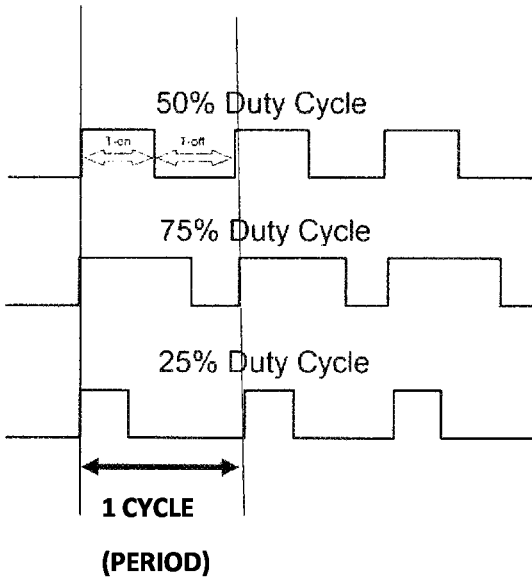
FIG. 8 is a schematic illustrating a series of typical duty cycles for a manufacturing process.

FIG. 8 shows schematics for several different possible "duty cycles" for alternating between an "on" condition and an "off" condition.

$$\text{Duty Cycle} = \frac{T_{on}}{T_{off} + T_{on}}$$

For example, a 50% duty cycle is characterized by the time intervals of $T_{on}$ and $T_{off}$ being equal. By contrast, a 75% duty cycle is characterized by the time interval for $T_{on}$ being three times the time interval of $T_{off}$. Meanwhile, a 25% duty cycle is characterized by the time interval of $T_{on}$ being three time shorter than the time interval of $T_{off}$.

Figure 9:
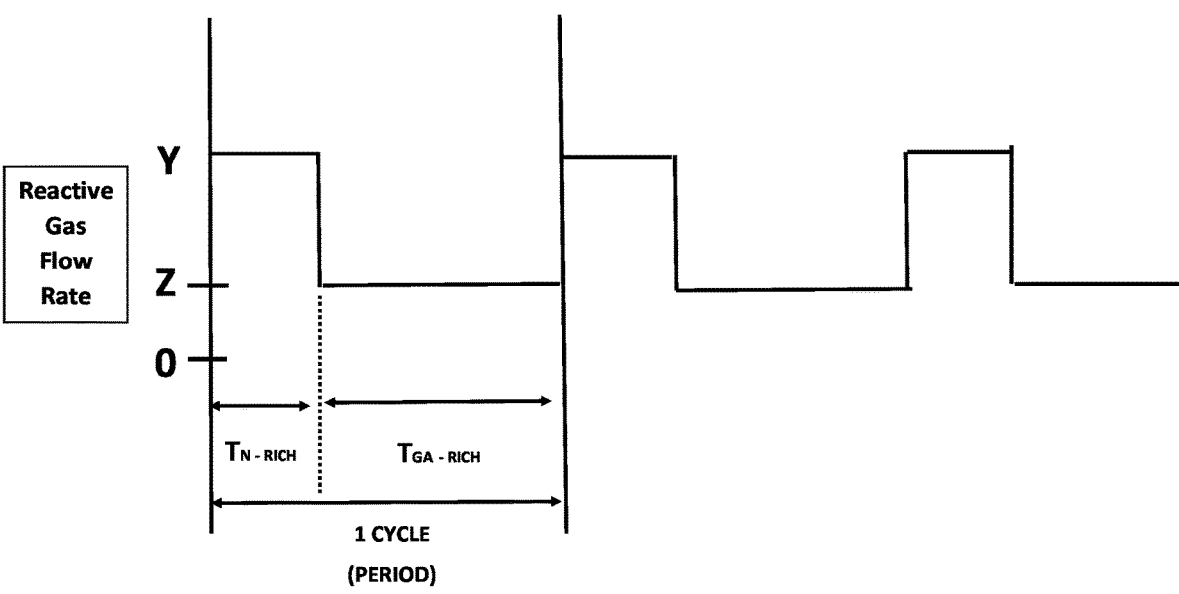
FIG. 9 is a schematic illustrating the duty cycle for the reactive gas modulation of the PVD sputtering process for producing semiconductor devices according to the invention.
Figure 10:
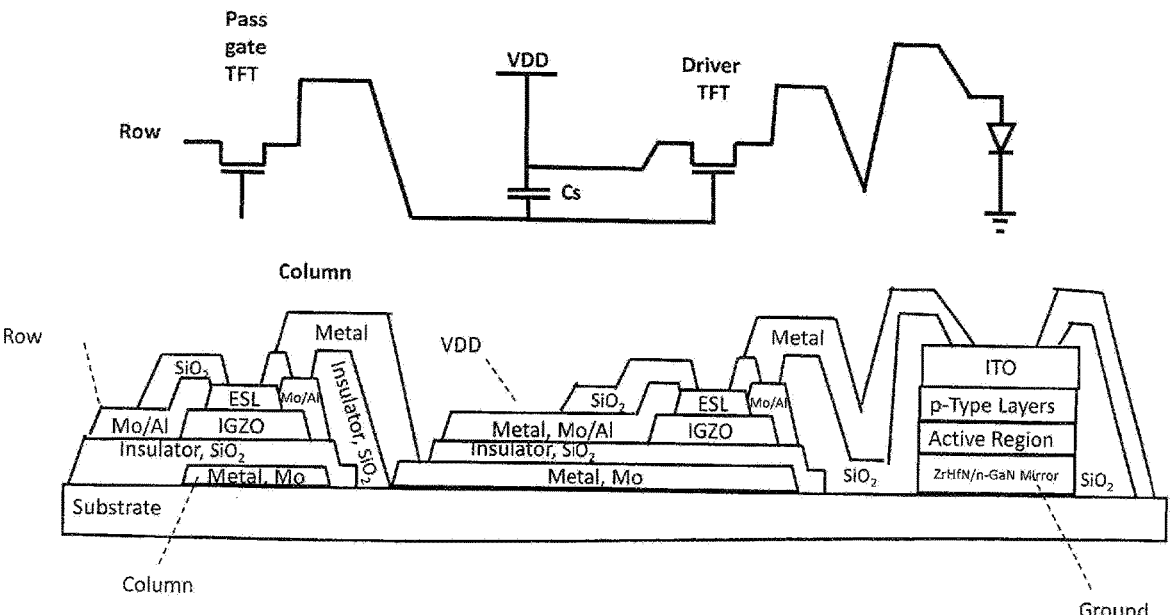
FIG. 10 is a schematic of a first structure under this invention containing layers of n-GaN and ZrHfN used as mirrors in combination with LED layers deposited onto CMOS active matrix backplanes that enables resulting device to block the light from propagating to the AM materials.
Figure 11:
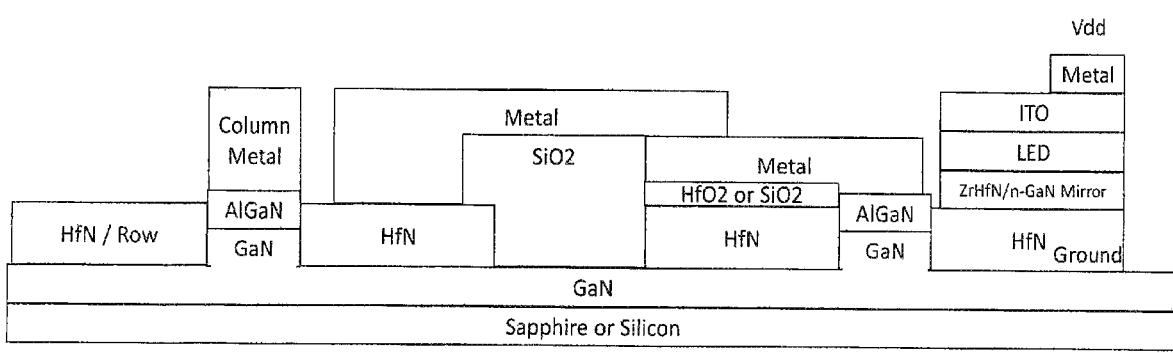
FIG. 11 is a schematic of a second structure containing such n-GaN and ZrHfN mirrors in combination with LED layers deposited onto CMOS active matrix backplanes.
Figure 11:
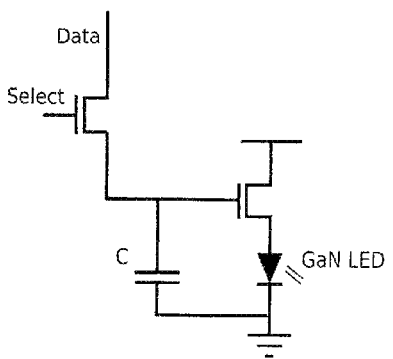

FIG. 9 shows a schematic for the duty cycle for the reactive gas modulation process of the present invention. The time interval for the Ga-rich condition should generally be longer than the time interval for the nitrogen-rich condition inside the vacuum chamber. If:

$$X = \frac{T_{Ga-rich}}{T_{nitrogen-rich}} + T_{Ga-rich}$$

then the Duty Cycle X value of should be 25-99%, preferably 25-75%.

Meanwhile, the amplitude of the curve represents the flow level for the reactive gas or the plasma. "Y" represents the flow rate of the nitrogen gas during the nitrogen-rich condition, while "Z" represents flow rate of the nitrogen gas during the Ga-rich condition. Therefore, the ratio Z/Y represents the percentage of the reactive gas flow rate during the gallium-rich condition compared with the flow rate of the reactive gas during the nitrogen-rich condition. Generally, this ratio during the Ga-rich condition should be 0-50%, preferably 0-20%. In the same manner, the degree of blockage of the mechanical shutter device inside the vacuum chamber for impeding the rise of the plasma to the substrate wafer during the Ga-rich condition should be 50-100%, preferably 80-100%. This represents a lower duty cycle X.

When you turn off or reduce the reactive gas flow to the vacuum chamber, even though some amount of reactive gas will remain in the chamber, you will still have less reactive gas to react with the Ga target to produce plasma. This produces the Ga-rich condition.

By modulating the flow of the reactive gas to the vacuum chamber during the duty cycle, or impeding the rise of the plasma inside the vacuum chamber during the duty cycle, several benefits are achieved for the PVD sputtering of the Group III/IV Compound onto the substrate wafer to form the resulting film layer. First, the modulation process enhances the efficiency of the GaN deposition process. The GaN deposition process can actually be sped up.

Second, the modulation process allows the growth of "better" crystals within the GaN layer. Under an X-ray scan, the resulting crystals exhibit smoother surfaces. Moreover, there is a reduced level of molecular imperfections inside the crystals. "Perfect" epitaxial crystalline material has all of the crystals oriented in the same direction. But in polycrystalline material, the single crystals are oriented in different directions. If the crystals are not properly aligned, a "line defect" results inside the epitaxial GaN material of the layer. As current flows through the semiconductor LED layers, current leakage will be caused by such line defects, and in extreme cases, can result in a shorting in the LED. This reduces the efficiency of the LED in its operation.

Moreover, crystalline defects can adversely affect the optical properties of semiconductors made from Group III/IV Compounds, including the epitaxial growth process for n-type material and p-type material layers. Adding a dopant like silicon to the, e.g., GaN compound enables electrons within the valance band of the layered structure to move into the "forbidden region" above it close to the conduction band that sits above the forbidden region. Light emitted by the active region inside the n-type GaN layer of the semiconductor structure more easily passes into the conduction band without being absorbed by the GaN material. But if an atom is missing in the valance band caused by a point defect in the n-type material, the electron that normally moves up into the forbidden layer will have nowhere to go, so it will travel to the conduction band instead.

Similarly, when a dopant like magnesium is added to the GaN to produce p-type material, the resulting holes in the valance band will be filtered by electrons dropping down from the forbidden region/band gap region and even the conduction band above it. This cascading effect causes new holes in the conduction band which are important for light emitted from the active region of the p-type GaN layer near the top of the structure of the semiconductor LED to be visible. Yet, point defects in the crystals of this p-type GaN material makes it very difficult to make the p-type material, itself.

Thus, by improving the crystalline structure of the GaN material, optical properties are improved for the semiconductor LED. This is important for the n-type, p-type, and GEMM layers that are incorporated into semiconductor structures, as discussed above.

Moreover, point defects in the crystalline structure of Group III/IV Compound materials can also harm the reflectivity of the metals contained therein. The reduction in such point defects via the modulation process for the reactive gas is therefore important for the GEMM, tunnel-barrier ("TB") epitaxial metal mirrors ("TB-GEMM"), and the metal caps for the semiconductor structures discussed above.

Crystalline defects formed inside the Group III/IV Compound layers can also lead to excessive heat production as the electrons try to move from the valance band to the conduction band, while impeding the passage of light through the structure. This heat build up can also cause the semiconductor to fail. Excessive heat buildup can also thwart efforts to design and produce smaller semiconductor LEDs that are crucial for their adoption by the industry.

Finally, growing more crystallinely perfect GaN layers in a semiconductor will provide smoother surfaces onto which to grow adjacent HfN and ZrN layers. Such HfN and ZrN layers are important for enhancing the reflectivity of the semiconductor LED and its emittance of visible light.

During the Ga-rich phase of the PVD sputtering process, the Ga atoms having a positive charge will be distributed onto the substrate wafer or previous Group III/IV Compound layer. The positively charged Ga atoms repel each other to produce an orderly matrix. When the nitrogen gas flow is increased during the nitrogen-rich phase of the Duty Cycle, the resulting active nitrogen atoms distributed onto the substrate or previous layer lock in the surrounding Ga+ atoms in an ideal pattern. Because more time is required for the nitrogen atoms to arrive in the matrix, a longer "off" cycle is required, which translates into a lower Duty Cycle.

The quantum wells contained inside semiconductor LED structures are often made from InGaN. This InGaN material usually produces blue color. But adding more In at the expense of Ga to the target material set on the cathode inside the vacuum chamber during the PVD sputtering process produces green color. Adding still more In at the expense of Ga produces red color. However, it is thermodynamically difficult to add In if the lattice spacing in the InGaN layer is off due to crystalline defects. The reactive gas modulation process allows superior lattice spacing in the resulting InGaN layer for the quantum well, as well as superior lattice matching between the materials of the layers in the semiconductor structure. Therefore, this reactive gas modulation process should enable the production of better green and red LEDs.

Deposition of layered materials to provide integrated functionality for integrated devices is more desired than mechanical placement of such layers. There is great interest in combining light-emitting devices with an active matrix ("AM") for display purposes as well as other devices. Mechanical placement of LEDs onto CMOS AM backplanes is one way to do this. A more desirable way of doing this is to deposit LED layers onto CMOS backplanes. However, a significant problem with this deposition approach is that there is no suitable mirror to deposit prior to depositing the LEDs where the LEDs are epitaxial. Under the present invention, layers of n-GaN and ZrHfN can be used as mirrors for this purpose, thereby enabling the resulting devices to block the light from propagating to the AM materials. Thermal considerations for integration are more favorable with these drawn structures.

The above specification and associated drawings produce a complete description of the structure and method for the Group III/IV Compound-based semiconductor devices and reactive gas modulation process of the present invention. Many alternative embodiments of the invention can be made without departing from the spirit and scope of the invention. Therefore, the invention resides in the claims herein appended.

I claim:

1. A method for growing a Group III or IV Compound semiconductor structure for a semiconductor device inside a vacuum chamber having a cathode and a plurality of anodes, comprising:

(a) providing a template having a surface to the vacuum chamber;

(b) providing at least one Group III or Group IV target material positioned on top of the cathode inside the vacuum chamber;

(c) providing a reactive gas as a separate plasma to the vacuum chamber;

(d) providing an inert gas to the vacuum chamber for surrounding the Group III or Group IV target material;

(e) growing at least a first Group III or IV Compound layer on the template using a first magnetron sputtering process, wherein the first magnetron sputtering process includes:

(i) bombarding atoms of the inert gas by electrons passing between an electrically positively charged anode and the cathode to produce positively charged inert gas cations, thereby prompting the resulting positively charged inert gas cations to bombard the target material to sputter the target material towards the template inside the vacuum chamber and react with the reactive gas to form a plasma of the Group III or IV Compound that rises inside the vacuum chamber to form a film of the Group III or IV Compound having covalent chemical bonds onto the template;

(ii) modulation of the flow of the reactive gas inside the vacuum chamber during a duty cycle comprising a target-rich condition and a reactive-gas condition combining a frequency of about 1 Hz-16 Hz for the sputtering of the Group III or Group IV target material between the target-rich condition and the reactive gas-rich condition, wherein the reactive gas still flows into the vacuum chamber during the target-rich condition portion of the duty cycle;

(f) wherein the modulation of the reactive gas during the duty cycle enhances the efficiency of the sputtering process for forming the Group III or IV Compound layer on the target, and improves the crystalline state of the resulting Group III or IV Compound layer within the semiconductor structure.

2. The method of claim 1, wherein the Group III or IV Compound comprises a nitride, oxide, arsenide, or phosphide compound for which the Group III metal cation is gallium (Ga), indium (In), or aluminum (Al), or the Group IV metal cation is silicon (Si), germanium (Ge), hafnium (Hf), or zirconium (Zr).

3. The method of claim 1, wherein the reactive gas comprises nitrogen ($N_2$), oxygen ($O_2$), the precursor for arsenide ($As^{-3}$), or the precursor for phosphide ($P^{-3}$).

4. The method of claim 1, wherein the Group III target comprises gallium (Ga) and the reactive gas comprises nitrogen.

5. The method of claim 4, wherein the target-rich condition comprises a Ga-rich condition and the reactive gas-rich condition comprises a nitrogen-rich condition.

6. The method of claim 1, wherein the time interval for the target-rich condition of the duty cycle is longer than the time interval for the reactive gas-rich condition of that duty cycle.

7. The method of claim 1, wherein the ratio Z/Y representing the percentage of the reactive gas flow rate during the target-rich condition of the duty cycle compared with the flow rate of the reactive gas during the reactive gas-rich condition of that duty cycle is about greater than zero, but less than or equal to twenty percent.

* * * * *